United States Patent
Hada et al.

(10) Patent No.: US 9,179,579 B2
(45) Date of Patent: Nov. 3, 2015

(54) SHEET HAVING HIGH THERMAL CONDUCTIVITY AND FLEXIBILITY

(75) Inventors: Sayuri Hada, Kanagawa (JP); Kuniaki Sueoka, Yamato (JP); Yoichi Taira, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 1786 days.

(21) Appl. No.: 12/303,804

(22) PCT Filed: Jun. 6, 2007

(86) PCT No.: PCT/JP2007/061481
§ 371 (c)(1),
(2), (4) Date: Aug. 20, 2010

(87) PCT Pub. No.: WO2007/142273
PCT Pub. Date: Dec. 13, 2007

(65) Prior Publication Data
US 2011/0198067 A1    Aug. 18, 2011

(30) Foreign Application Priority Data
Jun. 8, 2006  (JP) .................................. 2006-160343

(51) Int. Cl.
*F28F 1/36* (2006.01)
*F28F 7/00* (2006.01)
(Continued)

(52) U.S. Cl.
CPC ............ *H05K 7/20454* (2013.01); *B32B 9/007* (2013.01); *B32B 9/046* (2013.01); *H01L 23/373* (2013.01); *H01L 23/3735* (2013.01); *H01L 23/433* (2013.01); *H05K 7/20481* (2013.01);
(Continued)

(58) Field of Classification Search
CPC ........... H05K 7/20454; H05K 7/20481; H01L 23/373; H01L 23/433; H01L 23/3735; B32B 9/04; B32B 9/045; B32B 9/047; B32B 9/007
USPC ........... 165/185, 80.2, 80.3; 361/679.54, 688, 361/689, 690
See application file for complete search history.

(56) References Cited

U.S. PATENT DOCUMENTS 4,065,593 A * 12/1977 Peterson .......................... 428/92
4,252,391 A *  2/1981 Sado ............................... 439/91
(Continued)

FOREIGN PATENT DOCUMENTS

JP        7109171        4/1995
JP       2001023530      1/2001
(Continued)

*Primary Examiner* — Frantz Jules
*Assistant Examiner* — Claire Rojohn, III
(74) *Attorney, Agent, or Firm* — Janice Kwon; Anne Vachon Dougherty (57) ABSTRACT

[Problem] To reduce thermal resistance between a heating body and a radiating body.
[Solving Means] Provided is a sheet having a high thermal conductivity and flexibility, in which graphite layers and elastic layers are stacked alternately, and each of ends of the graphite layer in its surface direction or each of ends of a graphene protrudes from an end of the elastic layer and bends so as to cover at least a part of the end of the elastic layer. By placing a sheet of the present invention in a space (gap) between a heating body and a radiating body, thermal resistance at the gap, especially contact thermal resistance on a joint surface, can be reduced even in the case where flatness of a surface of the heating body or a surface of the radiating body is small.

8 Claims, 10 Drawing Sheets (51) Int. Cl.
*H05K 7/20* (2006.01)
*H01L 23/373* (2006.01)
*H01L 23/433* (2006.01)
*B32B 9/00* (2006.01)
*B32B 9/04* (2006.01)

(52) U.S. Cl.
CPC ... *B32B 2307/302* (2013.01); *H01L 2924/0002* (2013.01); *Y10T 29/4935* (2015.01)

(56) References Cited

U.S. PATENT DOCUMENTS

| | | | |
|---|---|---|---|
| 4,369,104 A * | 1/1983 | Beckley | 204/290.06 |
| 4,449,774 A * | 5/1984 | Takashi et al. | 439/590 |
| 4,466,483 A * | 8/1984 | Whitfield et al. | 165/185 |
| 4,606,962 A * | 8/1986 | Reylek et al. | 428/148 |
| 4,849,858 A * | 7/1989 | Grapes et al. | 361/708 |
| 4,888,247 A * | 12/1989 | Zweben et al. | 428/105 |
| 4,915,167 A * | 4/1990 | Altoz | 165/185 |
| 5,014,777 A * | 5/1991 | Sano | 165/185 |
| 5,026,748 A * | 6/1991 | Adams et al. | 524/66 |
| 5,041,183 A * | 8/1991 | Nakamura et al. | 156/264 |
| 5,052,481 A * | 10/1991 | Horvath et al. | 165/185 |
| 5,111,359 A * | 5/1992 | Montesano | 361/709 |
| 5,213,877 A * | 5/1993 | Yoshida et al. | 428/209 |
| 5,281,771 A * | 1/1994 | Swift et al. | 174/262 |
| 5,328,087 A * | 7/1994 | Nelson et al. | 228/175 |
| 5,396,044 A * | 3/1995 | Orlowski et al. | 219/121.66 |
| 5,474,458 A * | 12/1995 | Vafi et al. | 439/91 |
| 5,545,473 A * | 8/1996 | Ameen et al. | 428/212 |
| 5,561,321 A * | 10/1996 | Hirano et al. | 257/700 |
| 5,621,615 A * | 4/1997 | Dawson et al. | 361/704 |
| 5,695,847 A * | 12/1997 | Browne | 428/112 |
| 5,781,412 A * | 7/1998 | de Sorgo | 361/704 |
| 5,796,582 A * | 8/1998 | Katchmar | 361/704 |
| 5,812,374 A * | 9/1998 | Shuff | 361/704 |
| 5,849,130 A * | 12/1998 | Browne | 156/256 |
| 5,876,831 A * | 3/1999 | Rawal | 428/117 |
| 5,890,915 A * | 4/1999 | Reylek | 439/91 |
| 5,944,322 A * | 8/1999 | Coff et al. | 277/594 |
| 5,960,541 A * | 10/1999 | Shea | 29/879 |
| 6,033,787 A * | 3/2000 | Nagase et al. | 428/545 |
| 6,048,599 A * | 4/2000 | Chu et al. | 428/114 |
| 6,054,198 A * | 4/2000 | Bunyan et al. | 428/40.5 |
| 6,084,775 A * | 7/2000 | Bartley et al. | 361/705 |
| 6,097,602 A * | 8/2000 | Witchger | 361/705 |
| 6,110,354 A * | 8/2000 | Saban et al. | 205/775 |
| 6,197,859 B1 * | 3/2001 | Green et al. | 524/270 |
| 6,248,959 B1 * | 6/2001 | Sylvester | 174/256 |
| 6,261,699 B1 * | 7/2001 | Ress et al. | 428/293.1 |
| 6,294,408 B1 * | 9/2001 | Edwards et al. | 438/121 |
| 6,329,610 B1 * | 12/2001 | Takubo et al. | 174/264 |
| 6,411,513 B1 * | 6/2002 | Bedard | 361/704 |
| 6,444,921 B1 * | 9/2002 | Wang et al. | 174/260 |
| 6,496,373 B1 * | 12/2002 | Chung | 361/705 |
| 6,570,764 B2 * | 5/2003 | Bhatia et al. | 361/705 |
| 6,600,528 B2 * | 7/2003 | Colgan et al. | 349/95 |
| 6,644,395 B1 * | 11/2003 | Bergin | 165/185 |
| 6,651,736 B2 * | 11/2003 | Chiu et al. | 165/185 |
| 6,657,296 B2 * | 12/2003 | Ho et al. | 257/720 |
| 6,706,562 B2 * | 3/2004 | Mahajan et al. | 438/125 |
| 6,730,412 B2 * | 5/2004 | Kono et al. | 428/608 |
| 6,740,972 B2 * | 5/2004 | Smith et al. | 257/746 |
| 6,750,551 B1 * | 6/2004 | Frutschy et al. | 257/785 |
| 6,760,224 B2 * | 7/2004 | Moden et al. | 361/719 |
| 6,767,765 B2 * | 7/2004 | Chiu | 438/122 |
| 6,836,408 B2 * | 12/2004 | Gektin et al. | 361/704 |
| 6,844,957 B2 * | 1/2005 | Matsumoto et al. | 359/296 |
| 6,919,009 B2 * | 7/2005 | Stonas et al. | 205/74 |
| 6,947,293 B2 * | 9/2005 | DiBene et al. | 361/803 |
| 6,956,739 B2 * | 10/2005 | Bunyan | 361/700 |
| 6,992,891 B2 * | 1/2006 | Mallik et al. | 361/704 |
| 7,013,965 B2 * | 3/2006 | Zhong et al. | 165/185 |
| 7,016,196 B2 * | 3/2006 | Tomaru et al. | 361/702 |
| 7,023,699 B2 * | 4/2006 | Glovatsky et al. | 361/704 |
| 7,168,484 B2 * | 1/2007 | Zhang et al. | 165/185 |
| 7,221,570 B2 * | 5/2007 | Depew | 361/719 |
| 7,270,885 B1 * | 9/2007 | Karandikar et al. | 428/446 |
| 7,289,326 B2 * | 10/2007 | Heydari et al. | 361/699 |
| 7,342,306 B2 * | 3/2008 | Colbert et al. | 257/712 |
| 7,352,585 B2 * | 4/2008 | Mandel et al. | 361/714 |
| 7,355,855 B2 * | 4/2008 | Karidis et al. | 361/710 |
| 7,362,582 B2 * | 4/2008 | Karidis et al. | 361/710 |
| 7,396,494 B1 * | 7/2008 | Sueoka et al. | 264/29.2 |
| 7,443,685 B2 * | 10/2008 | Pedoeem et al. | 361/719 |
| 7,485,970 B2 * | 2/2009 | Hsu et al. | 257/779 |
| 7,514,290 B1 * | 4/2009 | Sakuma et al. | 438/108 |
| 7,649,266 B2 * | 1/2010 | Ploessl et al. | 257/778 |
| 7,663,883 B2 * | 2/2010 | Shirakami et al. | 361/700 |
| 7,760,504 B2 * | 7/2010 | Farrow et al. | 361/704 |
| 7,839,645 B2 * | 11/2010 | Pauley et al. | 361/721 |
| 7,847,191 B2 * | 12/2010 | Swift et al. | 174/110 R |
| 7,981,495 B2 * | 7/2011 | Kim et al. | 428/86 |
| 7,995,081 B2 * | 8/2011 | Stowe et al. | 347/112 |
| 8,003,420 B2 * | 8/2011 | Maekawa | 438/34 |
| 8,026,447 B2 * | 9/2011 | Jacobsen et al. | 174/128.1 |
| 8,033,836 B1 * | 10/2011 | Bhakta et al. | 439/71 |
| 8,048,690 B2 * | 11/2011 | Terada et al. | 438/15 |
| 8,164,909 B2 * | 4/2012 | Nagase et al. | 361/728 |
| 8,169,767 B2 * | 5/2012 | Pruss et al. | 361/226 |
| 8,225,704 B2 * | 7/2012 | Ogrin et al. | 89/36.02 |
| 8,234,960 B2 * | 8/2012 | Swift et al. | 83/549 |
| 8,300,420 B2 * | 10/2012 | Tsai et al. | 361/760 |
| 2001/0033476 A1 * | 10/2001 | Dibene et al. | 361/702 |
| 2001/0047858 A1 * | 12/2001 | McCullough | 165/80.3 |
| 2002/0089828 A1 * | 7/2002 | Suzuki et al. | 361/709 |
| 2002/0105071 A1 * | 8/2002 | Mahajan et al. | 257/720 |
| 2002/0131240 A1 * | 9/2002 | Kim | 361/719 |
| 2002/0138973 A1 * | 10/2002 | Ishikawa et al. | 29/739 |
| 2003/0043316 A1 * | 3/2003 | Matsumoto et al. | 349/84 |
| 2003/0098632 A1 * | 5/2003 | Takeuchi et al. | 310/328 |
| 2003/0102553 A1 * | 6/2003 | Ishikawa et al. | 257/707 |
| 2003/0117775 A1 * | 6/2003 | Vrtis et al. | 361/705 |
| 2003/0203188 A1 * | 10/2003 | H. | 428/328 |
| 2004/0074951 A1 * | 4/2004 | Takahashi et al. | 228/219 |
| 2004/0113161 A1 * | 6/2004 | Suzuki et al. | 257/83 |
| 2004/0123968 A1 * | 7/2004 | Osanai et al. | 164/98 |
| 2004/0164402 A1 * | 8/2004 | Yoshimura | 257/706 |
| 2004/0177947 A1 * | 9/2004 | Krassowski et al. | 165/104.33 |
| 2004/0191558 A1 * | 9/2004 | Ishikawa et al. | 428/615 |
| 2004/0207072 A1 * | 10/2004 | Hiramatsu et al. | 257/705 |
| 2004/0207987 A1 * | 10/2004 | Ishikawa et al. | 361/709 |
| 2004/0218354 A1 * | 11/2004 | Lee et al. | 361/687 |
| 2004/0265489 A1 * | 12/2004 | Dubin | 427/212 |
| 2005/0006083 A1 * | 1/2005 | Chen et al. | 165/185 |
| 2005/0028359 A1 * | 2/2005 | McCullough | 29/832 |
| 2005/0029009 A1 * | 2/2005 | Swift et al. | 174/255 |
| 2005/0061474 A1 * | 3/2005 | Gelorme et al. | 165/80.2 |
| 2005/0061496 A1 * | 3/2005 | Matabayas, Jr. | 165/185 |
| 2005/0068725 A1 * | 3/2005 | Houle et al. | 361/688 |
| 2005/0072563 A1 * | 4/2005 | Wang et al. | 165/185 |
| 2005/0078433 A1 * | 4/2005 | Ichiyanagi et al. | 361/301.4 |
| 2005/0092478 A1 * | 5/2005 | Jairazbhoy et al. | 165/185 |
| 2005/0151554 A1 * | 7/2005 | Rae et al. | 324/760 |
| 2005/0151555 A1 * | 7/2005 | Lewis et al. | 324/760 |
| 2005/0155751 A1 * | 7/2005 | Azuma et al. | 165/185 |
| 2005/0180113 A1 * | 8/2005 | Shirakami et al. | 361/704 |
| 2005/0214518 A1 * | 9/2005 | Nagase et al. | 428/210 |
| 2005/0230795 A1 * | 10/2005 | Furuyama et al. | 257/678 |
| 2005/0250262 A1 * | 11/2005 | Suzuki et al. | 438/151 |
| 2006/0011336 A1 * | 1/2006 | Frul | 165/185 |
| 2006/0035069 A1 * | 2/2006 | Hanai | 428/316.6 |
| 2006/0035413 A1 * | 2/2006 | Rae et al. | 438/122 |
| 2006/0037741 A1 * | 2/2006 | Tokuhira et al. | 165/185 |
| 2006/0039660 A1 * | 2/2006 | Henze et al. | 385/115 |
| 2006/0043553 A1 * | 3/2006 | Yang et al. | 257/678 |
| 2006/0048932 A1 * | 3/2006 | Rubenstein et al. | 165/185 |
| 2006/0053345 A1 * | 3/2006 | Goodwin | 714/42 |
| 2006/0065387 A1 * | 3/2006 | Tonapi et al. | 165/185 |
| 2006/0086487 A1 * | 4/2006 | Yang et al. | 165/146 |
| 2006/0131010 A1 * | 6/2006 | Hsu et al. | 165/185 |
| 2006/0157223 A1 * | 7/2006 | Gelorme et al. | 165/80.3 |
| 2006/0225874 A1 * | 10/2006 | Shives et al. | 165/185 |
| 2006/0250780 A1 * | 11/2006 | Goodwin | 361/767 |

(56) References Cited

U.S. PATENT DOCUMENTS

| | | | |
|---|---|---|---|
| 2006/0260793 A1* | 11/2006 | Yang et al. | 165/185 |
| 2006/0272796 A1* | 12/2006 | Asmussen et al. | 165/53 |
| 2007/0062676 A1* | 3/2007 | Yao | 165/104.33 |
| 2007/0102142 A1* | 5/2007 | Reis et al. | 165/80.3 |
| 2007/0169345 A1* | 7/2007 | Ghosh | 29/890.03 |
| 2007/0175621 A1* | 8/2007 | Datta et al. | 165/185 |
| 2007/0295496 A1* | 12/2007 | Hall et al. | 165/185 |
| 2008/0040920 A1* | 2/2008 | Brackenbury et al. | 29/832 |
| 2008/0053647 A1* | 3/2008 | Namkoong et al. | 165/185 |
| 2008/0088033 A1* | 4/2008 | Humpston et al. | 257/778 |
| 2008/0128122 A1* | 6/2008 | Huang et al. | 165/185 |
| 2008/0198553 A1* | 8/2008 | Tokuhira | 361/705 |
| 2008/0218972 A1* | 9/2008 | Sauciuc et al. | 361/704 |
| 2009/0166854 A1* | 7/2009 | Jewram et al. | 257/713 |
| 2009/0219698 A1* | 9/2009 | Chao | 361/718 |
| 2010/0032143 A1* | 2/2010 | Datta et al. | 165/104.33 |
| 2010/0040796 A1* | 2/2010 | Chueh | 427/453 |
| 2010/0117222 A1* | 5/2010 | Too et al. | 257/704 |
| 2010/0132932 A1* | 6/2010 | Kluge | 165/185 |
| 2010/0149756 A1* | 6/2010 | Rowcliffe et al. | 361/714 |
| 2010/0186938 A1* | 7/2010 | Murata et al. | 165/185 |
| 2010/0208432 A1* | 8/2010 | Bhagwagar et al. | 361/717 |
| 2010/0218512 A1* | 9/2010 | Alahyari et al. | 62/3.3 |
| 2010/0246133 A1* | 9/2010 | Schmidt et al. | 361/705 |

FOREIGN PATENT DOCUMENTS

| | | |
|---|---|---|
| JP | 2001024117 | 1/2001 |
| JP | 2003168882 | 6/2003 |

* cited by examiner

SHEET HAVING HIGH THERMAL CONDUCTIVITY AND FLEXIBILITY

TECHNICAL FIELD

The present invention generally relates to sheet having high thermal conductivity and flexibility. The present invention particularly relates to a thermal conduction module using a sheet having high thermal conductivity and flexibility, and a manufacturing method of the sheet and the thermal conduction module.

BACKGROUND ART

In recent years, as electronic devices for microprocessor (CPU) and the like are made to have higher performance and to be smaller, heat generated by the electronic devices has been increasing. Accordingly, a cooling technique having a high cooling capacity for electronic devices is demanded. Generally, an electronic device is cooled down by use of a radiator part, such as a heat sink. An electronic device and a radiator part are joined with each other by a highly thermal conductive material so that thermal resistance can be reduced at the joint (gap).

Surfaces of an electronic device and a radiator part are not completely flat and have minute bumps. Accordingly, in the case of using a hard heat transfer material, such as metal, at a joint gap between the electronic device and the radiator part, joint (adhesion) between the material and the electronic device or the radiator part is insufficient. As a result, the thermal resistance at the joint is increased. Therefore, currently, a thermal grease, a phase change sheet, and the like which can fill the uneven joint gap without leaving any space therein have been widely used. However, the thermal conductivities of these heat transfer materials are lower than that of a metal material (in many cases, <<10 W/mK). Accordingly, there arises a problem of having a higher thermal resistance when the joint gap is thicker.

Japanese Patent Application Publication No. Hei 8-238707 disclose a radiating sheet made of a silicone rubber substrate with an additive agent, such as a metal powder. U.S. Pat. No. 6,651,736 discloses a method of adding as a filling agent a carbon material to a binder such as grease and polymer. However, even when these methods are adopted, the thermal conductivity of a whole system is under constraint of the thermal conductivity of a substrate (binder). Accordingly, it is impossible to sufficiently reduce thermal resistance.

Japanese Patent Application Publications No. Hei 10-56114 and No. Hei 11-302545 and U.S. Pat. No. 5,695,847, disclose sheet-like heat transfer parts in which graphite fibers and the like are orientated perpendicularly to a joint plane. A carbon-based composite part obtained in this method exhibits high thermal conductivity in a bulk state. However, such a heat transfer part allows generation of a space in a joint part as similar to the case of using the above-described hard heat transfer material, such as metal. As a result, the thermal resistance in the entire joint gap including the space is increased.

[Patent Document 1] Japanese Patent Application Publication No. Hei 8-238707
[Patent Document 2] U.S. Pat. No. 6,651,736
[Patent Document 3] Japanese Patent Application Publication No. Hei 10-56114
[Patent Document 4] Japanese Patent Application Publication No. Hei 11-302545
[Patent Document 5] U.S. Pat. No. 5,695,847

DISCLOSURE OF THE INVENTION

Problems to be Solved by the Invention

An object of the present invention is to provide a connection part having high thermal conductivity and flexibility.

An object of the present invention is to reduce thermal resistance at a space (gap) between a heating body and a radiating body.

An object of the present invention is to increase heat conduction efficiency from a heating body surface to a radiating body surface.

An object of the present invention is to reduce contact thermal resistance on a joint surface regardless of the surface condition of a joint surface.

Means for Solving the Problems

According to the present invention, provided is a highly thermal conductive and flexible sheet in which graphite layers and elastic layers are stacked alternately, and ends of the graphite sheet in its surface direction protrude from ends of the elastic layer and bend so as to cover at least a part of the ends of the elastic layer.

According to the present invention, provided is a thermal conduction module, which is a heating body, a radiating body, and a sheet arranged between the heating body and the radiating body, in which graphite layers and elastic layers are arranged alternately, ends of the graphite layer in its surface direction protrude from ends of the elastic layer and bend so as to cover at least a part of the ends of the elastic layer, one end of the graphite layer in its surface direction is in contact with a surface of the radiating body, and another end is in contact with a surface of the heating body.

Effects of the Invention

By arranging a sheet of the present invention in a space (gap) between a heating body and a radiating body, it is possible to reduce thermal resistance in the gap.

By arranging a sheet of the present invention in a space (gap) between a heating body and a radiating body, it is possible to reduce thermal resistance at the gap, especially contact thermal resistance on a joint surface, even in the case where the flatness of a surface of the heating body or a surface of the radiating body is small.

By arranging a sheet of the present invention in a space (gap) between a heating body and a radiating body, it is possible to increase heat conduction efficiency from a surface of the heating body to a surface of the radiating body.

BEST MODE FOR CARRYING OUT THE INVENTION

Figure 1:
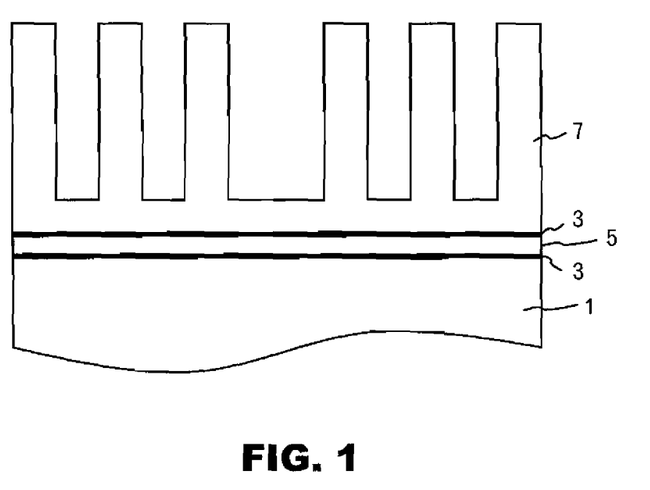
FIG. 1 is a schematic view of one Example of a thermal conduction module of the present invention.

The present invention will be described in detail below by referring to drawings. FIG. 1 is a schematic drawing of an example of a thermal conduction module of the present invention. A sheet 5 having high thermal conductivity and flexibility is arranged between a heating body 1 and a radiating body 7 through a filling material 3. For the heating body 1, an electronic part (IC chip, semiconductor device), such as a microprocessor, is appropriate, for example. For the radiating body 7, a heat sink made of aluminum is appropriate, for example. The filling material 3 is not an essential item. The filling material 3 maybe filled in at least one of spaces between the heating body 1 and the sheet 5, and between the radiating body 7 and the sheet 5. The filling material 3 is made of a fluid material, such as a silicone oil, a liquid metal, and a radiating grease.

Figure 2:
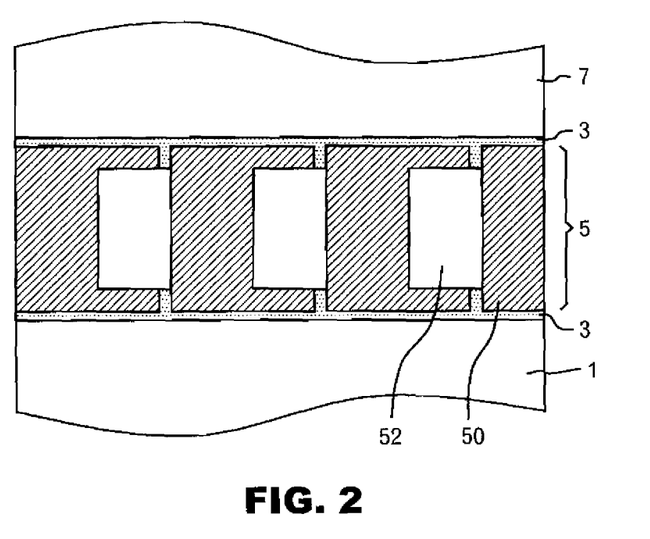
FIG. 2 is an enlarged view of a sheet 5 in FIG. 1.

FIG. 2 is an enlarged view of the sheet 5 in FIG. 1. The sheet 5 has graphite layers 50 and elastic layers 52 arranged (stacked) alternately. The elastic layer 52 is made of a resin material having adhesiveness to the graphite layer 50. For the resin material, silicone-based, polyimide-based, and acrylic-based materials, for example, are appropriate. An end of the graphite layer 50 in its surface direction (the vertical direction in FIG. 2) sticks out from an end of the elastic layer 52, and bends so as to cover at least a part of the end of the elastic layer 52. One (upper) end surface of the graphite layer 50 is in contact with a surface of the heating body 7, while another (lower) end is in contact with a surface of the radiating body 1. Here, FIG. 2 illustrates the case where an end of the graphite layer 50 is in contact with the surface of the radiating body 7 or the surface of the heating body 1 through the filling material 3. However, not limited to this configuration, the graphite layer 50 may have its end directly in contact with the surface of the radiating body 7 or the surface of the heating body 1.

Figure 3:
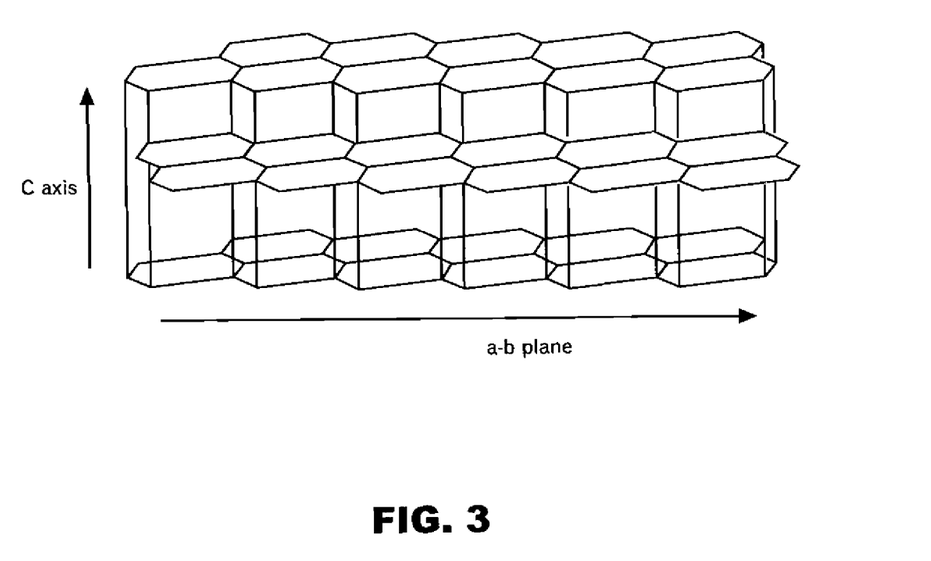
FIG. 3 is a view illustrating a graphene structure in which carbon atoms are arranged.

According to The graphite layer 50 is composed of graphite in a multilayer structure. Graphite has layers in which carbon atoms are arranged in a honeycomb structure in a surface direction (a-b plane) as illustrated in FIG. 3. These individual layers are called graphene. Graphite is a polymer and is to be bound as one layer. The surface direction of the graphite (a-b plane) corresponds to a vertical direction of FIG. 2. Within graphite, heat is mainly transmitted by lattice vibration of crystals, called phonons. The distance between graphenes is approximately 2.4-times farther than the distance between adjacent atoms in a graphene plane. Accordingly, graphite has a higher thermal conductivity in the graphene surface direction (a-b plane) (thermal anisotropy). In FIG. 3, the thermal conductivity in the surface direction (a-b plane) is approximately 100-times to 1000-times higher than that in the vertical (c-axis) direction. Therefore, it is important that the graphite contacts the surface of the radiating body or the heating body in the surface direction, that is, on an end surface of the graphene. This is because lattice vibration or phonon is more easily transmitted to the graphene plane by having the end surface of graphene being in contact, and, as a result, thermal resistance can be reduced at the contact part. In the present invention, it is important that a layer of carbon atoms of graphite or a graphene is maintained throughout the entire gap, including the end surface (contact part), between the heating body and the radiating body.

At the same time, it is important in the present invention that an end of the graphite layer be widened so as to cover an end of the elastic layer. This is because it is possible to increase a contact area between the end surface of the graphite layer having high thermal conductivity and the heating body (radiating body), as well as to reduce a contact area between the end of the elastic layer having a low thermal conductivity and the heating body (radiating body). As a result, coupled with the above-described contact at the end surface, it is possible to further reduce thermal resistance at the contact part.

Figure 4:
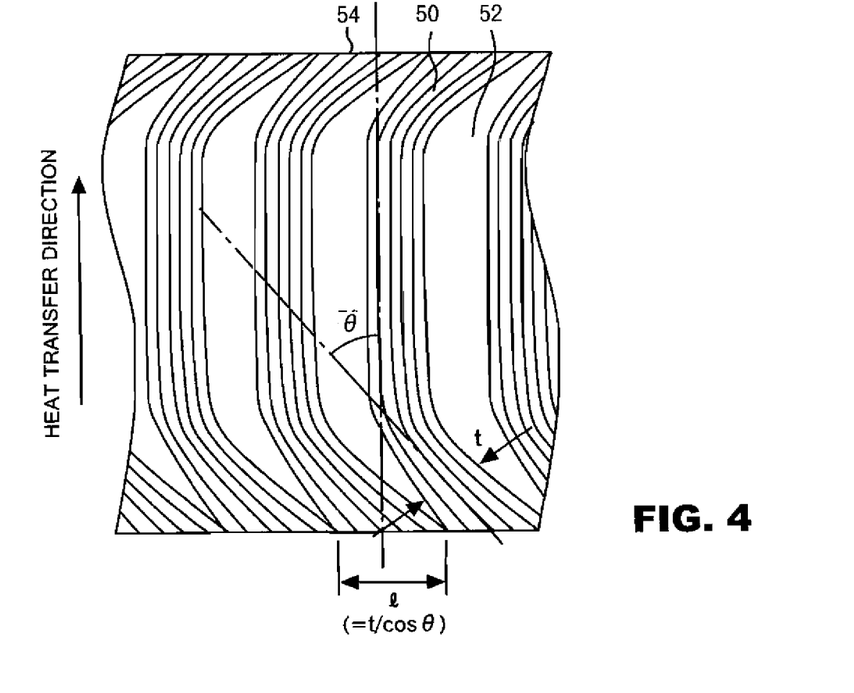
FIG. 4 is a view illustrating an example of the shape of a graphite layer 50 of the present invention.
Figure 5:
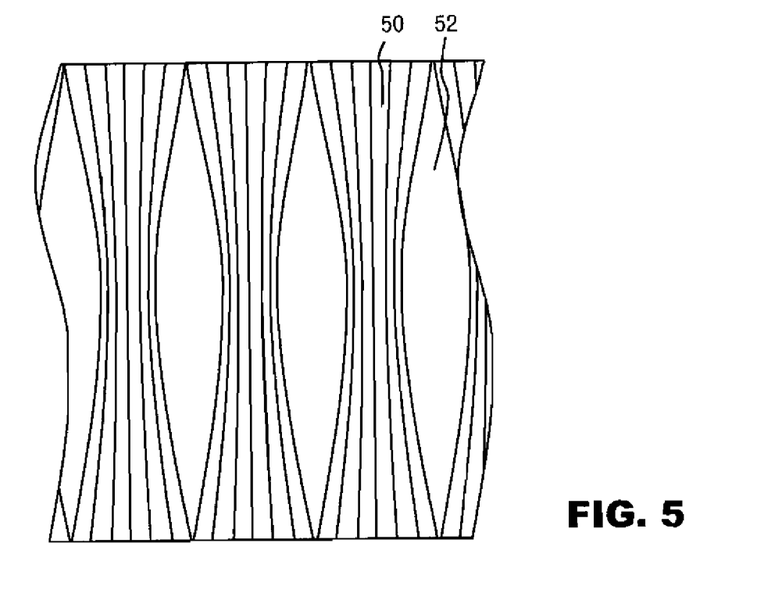
FIG. 5 is a view illustrating the shape of a graphite layer of one Example of the present invention.

FIG. 4 is a view illustrating an example of the shape of the graphite layer 50. In order to clearly show the multilayer structure, individual graphite layers are illustrated as multiple lines. The expansion L of an end of the graphite layer can be estimated as $L=t/\cos\theta$ when the bend angle is $\theta$ and the thickness of the graphite layer 50 is t. In FIG. 4, the end surface of the graphite layer 50 is almost completely covering the end of the elastic layer 52. The shape illustrated in FIG. 4 in a way represents an ideal shape of the graphite layer. The end of the graphite layer is not limited to the case of bending in one direction as illustrated in FIG. 4. An end of the graphite layer may be spreading so as to cover ends of two adjacent elastic layers (fan-like shape, inverted-triangle shape) as illustrated in FIG. 5. Moreover, the graphite layer may be in an "S-letter shape" in which its ends bend in opposite directions to contact two different surfaces.

Figure 6:
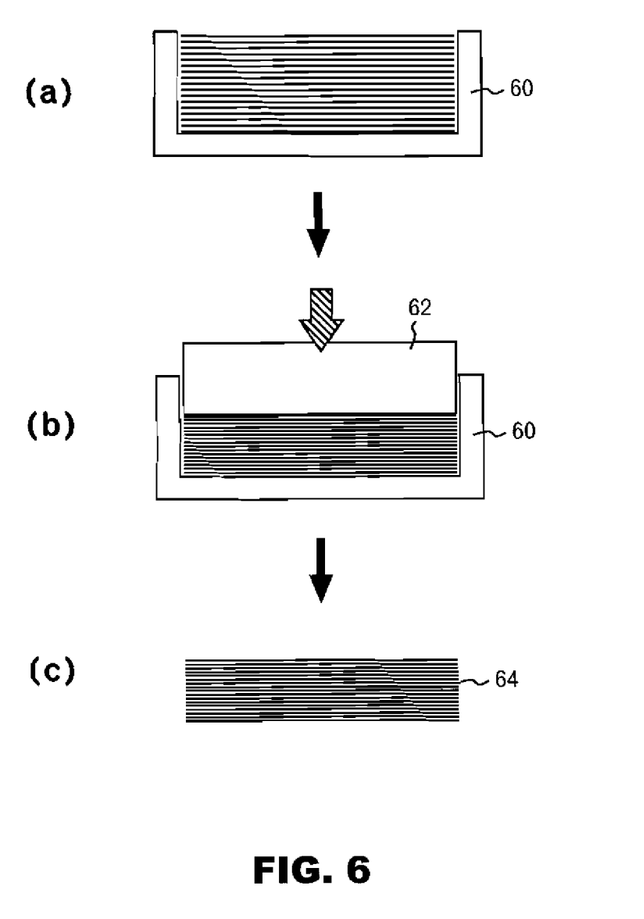
FIG. 6 is a view illustrating a step of forming a block in a manufacturing method of the present invention.

A manufacturing method of the sheet 5 of the present invention will be described by referring to FIGS. 6 to 10. Firstly, a block is formed by stacking graphite layers and elastic layers alternately. FIG. 6 illustrates a forming step of the block. In FIG. 6(a), a template (mold) 60 made of Teflon® is prepared. Graphite layers and elastic layers are placed alternately and stacked on top of each other in the mold. The numbers of graphite layers and elastic layers are appropriately selected according to the size of a heating body (radiating body). As the graphite layer, a commercially-available graphite sheet, the "PGS" graphite sheet (product number: EYGS091310, thickness: 0.1 mm) made by Matsushita, for example, is used. As the elastic layer, a commercially-available uncured liquid elastomer, a silicone elastomer, for example, is used. In FIG. 6(b), while applying pressure to a layered body with a weight 62, the layered body is heated at 150° C. for 60 minutes in an oven. The liquid elastomer is cured by the heating, and a solid block 64 is formed (FIG. 6(c)).

Figure 7:
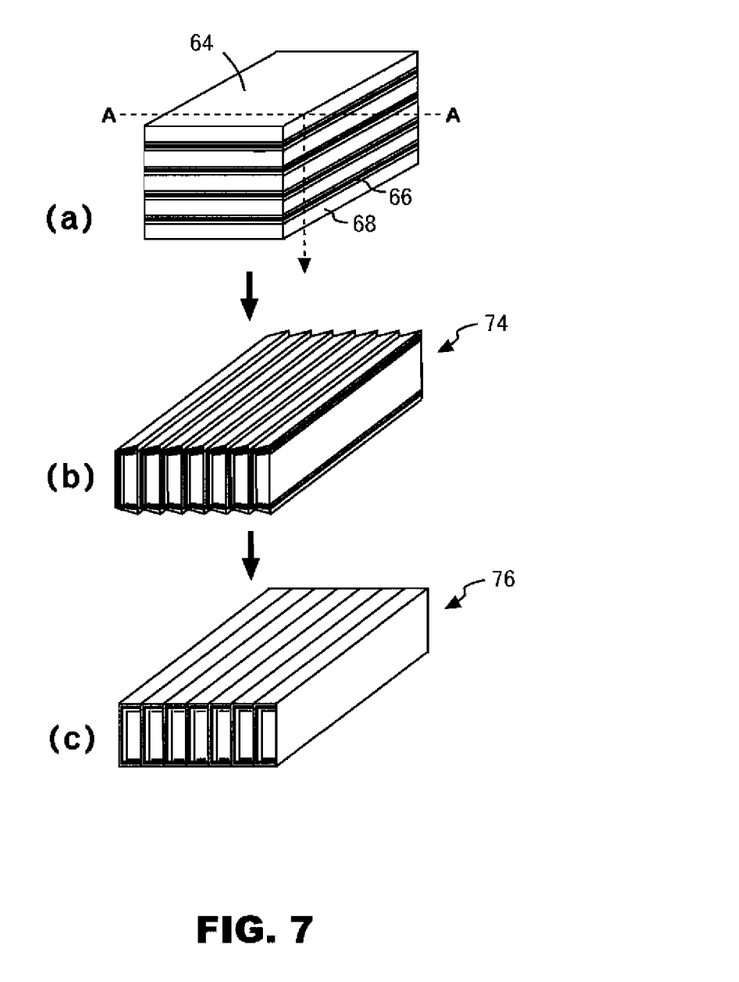
FIG. 7 is a view illustrating one Example of the manufacturing method of the present invention.

Refer to FIG. 7. FIG. 7(a) illustrates the block 64. Graphite layers (PGS) 66 and elastic layers (silicone elastomer) 68 are stacked on top of each other. The block 64 is cut along a stacking direction to form multiple sub-blocks. For example, the block 64 is cut along a dotted line A-A in FIG. 7(a) in a vertical direction. For the cutting, a cutting machine equipped with a diamond blade, a diamond saw, and the like can be used. The thickness of the sheet to be cut out is in a range from 1 μm to 2 mm. In this cutting, an end (cut surface) of the graphite layer 66 is caused to protrude from an end (cut surface) of the elastic layer 68 in a cut-out sub-block. At the same time, the end (cut surface) of the graphite layer 66 is bent so as to cover at least one part of the end (cut surface) of the elastic layer 68. Therefore, it is necessary to adjust a cutting rate, load applied to a cutting blade, and type of the cutting blade. For example, in the case where the rate of rotations of a diamond blade is set to 120 rpm and the load is 25 g, ends of the present invention can be formed in a highly-reproducible fashion. Note that, when the load was set to 75 g and the rate was set to 200 rpm, the end shape of the present invention could not be obtained. In this step, the graphite layers having their ends protruding and bending as illustrated in FIG. 7(b) or FIG. 4 was obtained.

In order to obtain this end shape of the graphite layer more easily, it is further necessary to keep in mind the following points. Firstly, adhesion strength between graphite layers (PGS) in the step illustrated in FIG. 6 is adjusted. To be more specific, temperature and time for curing the elastic layers (silicone elastomer) are adjusted. The reason for this is to give a degree of freedom to the PGS sheets in the cutting process illustrated in FIG. 7. If the PGS sheets have a degree of freedom, the elastic layers (silicone elastomer) having low hardness are selectively cut when cutting is performed with a cutting blade, such as a diamond blade. As a result, ends of the PGS sheets having high hardness remain, and the end surfaces protrude from the end surfaces of the elastic layers. Then, the load of the blade is applied in a direction to bend the projecting parts. Accordingly, the projecting parts are bent so as to cover the surfaces (ends) of the elastic layers (FIG. 4). In order to give a degree of freedom, an elastic layer having extremely low hardness, a silicone elastomer KE1308 (JIS-A hardness 7) made by Shin-Etsu Chemical Co., Ltd. for example, may be used.

In the case where there is a risk that adhesion strength between the graphite layers (PGS) is so low that the block cannot support itself when being cut, the periphery of the block is fixed. As a method for fixing, firstly, the periphery of the block is fixed with a flexible material, such as elastomer, in order to maintain the flexibility of the block. To be more specific, for example, the block is placed in an uncured silicone elastomer material, and vacuuming is performed thereon. The elastomer goes into the composite block. Thereafter, the silicone elastomer is cured. Then, the periphery of the block is further fixed by a material having high hardness, such as epoxy, in order to prevent the sheet (sub block) from bending due to stress applied in cutting. Note that this fixing is performed as necessary. Referring back to FIG. 7(c), the graphite layers having bent ends are trimmed by a grinder and the like so as to planarize the surface (end surface). The reason for this is to provide a denser connection between the end surfaces of the graphite layers and the surface of the heating body or the radiating body. Note that this planarization may be omitted.

Another manufacturing method will be described by referring to FIG. 8. FIG. 8(a) illustrates the same block 64 illustrated in FIG. 7(a). The block 64 is cut along a stacking direction to form multiple sub-blocks. For example, the block 64 is cut along a dotted line A-A in FIG. 7(a) in a vertical direction. This method is basically the same as that in the case of FIG. 7 up to this point. Different from the case of FIG. 7, the cutting is performed so that the cut surface can be flat in the case of FIG. 8(a). In other words, cutting is not performed so that the end surfaces of the graphite layers protrude from the end surfaces of the elastic layers. In order to achieve that, the rate of rotations of a diamond blade used for cutting, load thereto, and the like are adjusted. After the cutting, a sub-block (sheet) 70 having an approximately flat cut surface is obtained (FIG. 8(b)). The surfaces of the elastic layers (silicone elastomer) in the block after the cutting are subjected to etching. To be more specific, the sheet (block) 70 is put into an etching solution for silicone etching, or the etching solution is sprayed onto the surface of the block 70. The amount of silicone to be removed is controlled by time and temperature of etching.

Figure 8:
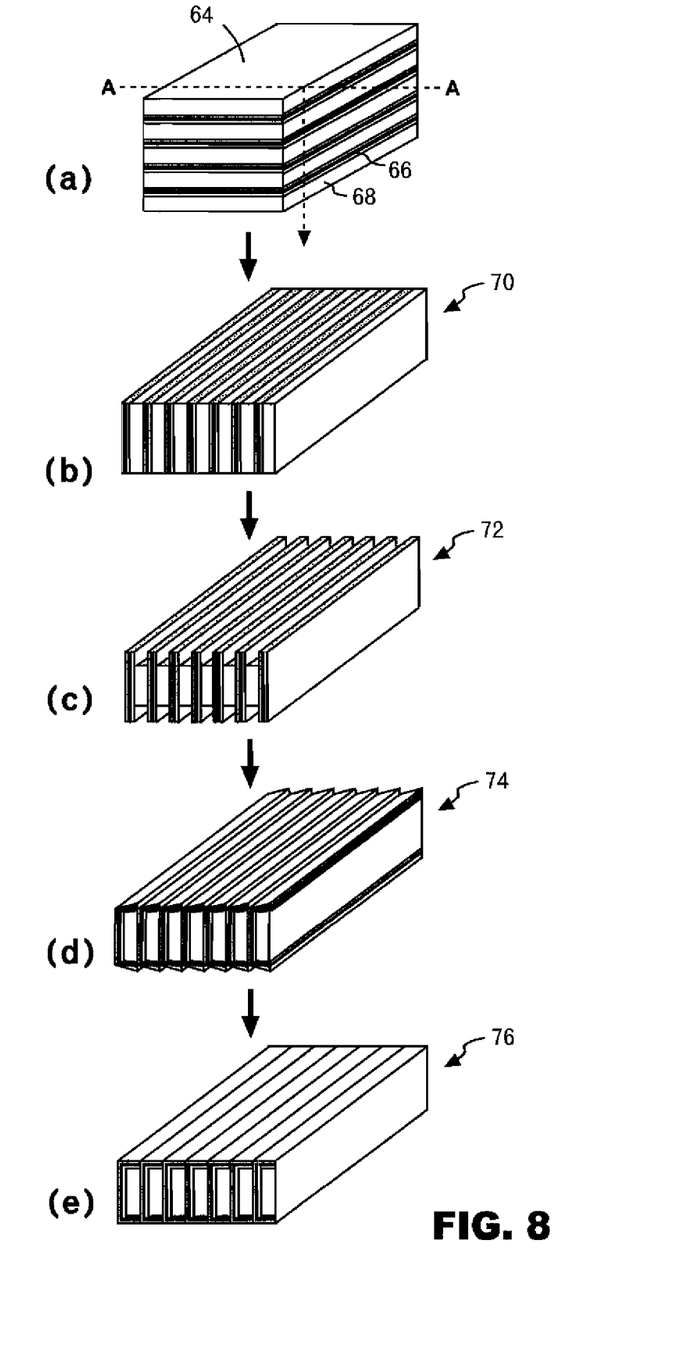
FIG. 8 is a view illustrating one Example of the manufacturing method of the present invention.

FIG. 8(c) illustrates a sheet 72 after the etching. Ends of the graphite layers protrude by the amount of the removed silicone elastomer. Next, pressure is applied by use of a roller or the like to the surface from which the ends of the graphite layers protrude, so as to bend the protruding ends. At this time, bending is performed so that an end of one graphite layer can cover an end surface of a neighboring elastic layer. FIG. 8(d) illustrates a sheet 74 in a state where the ends of the graphite layers are bent. Thereafter, as in the case of FIG. 7(c), the graphite layers each having bent ends are trimmed by a grinder and the like so as to planarize the surface (end surface). This planarization may be omitted. Finally, a structure 76 illustrated in FIG. 8(e) is obtained. Note that, in the bending, an end of a graphite layer may be bent so as to cover two neighboring (front and back) elastic layers. In this case, the shape (fan-like shape) of the graphite layer 50 illustrated in FIG. 5 is obtained.

Figure 9:
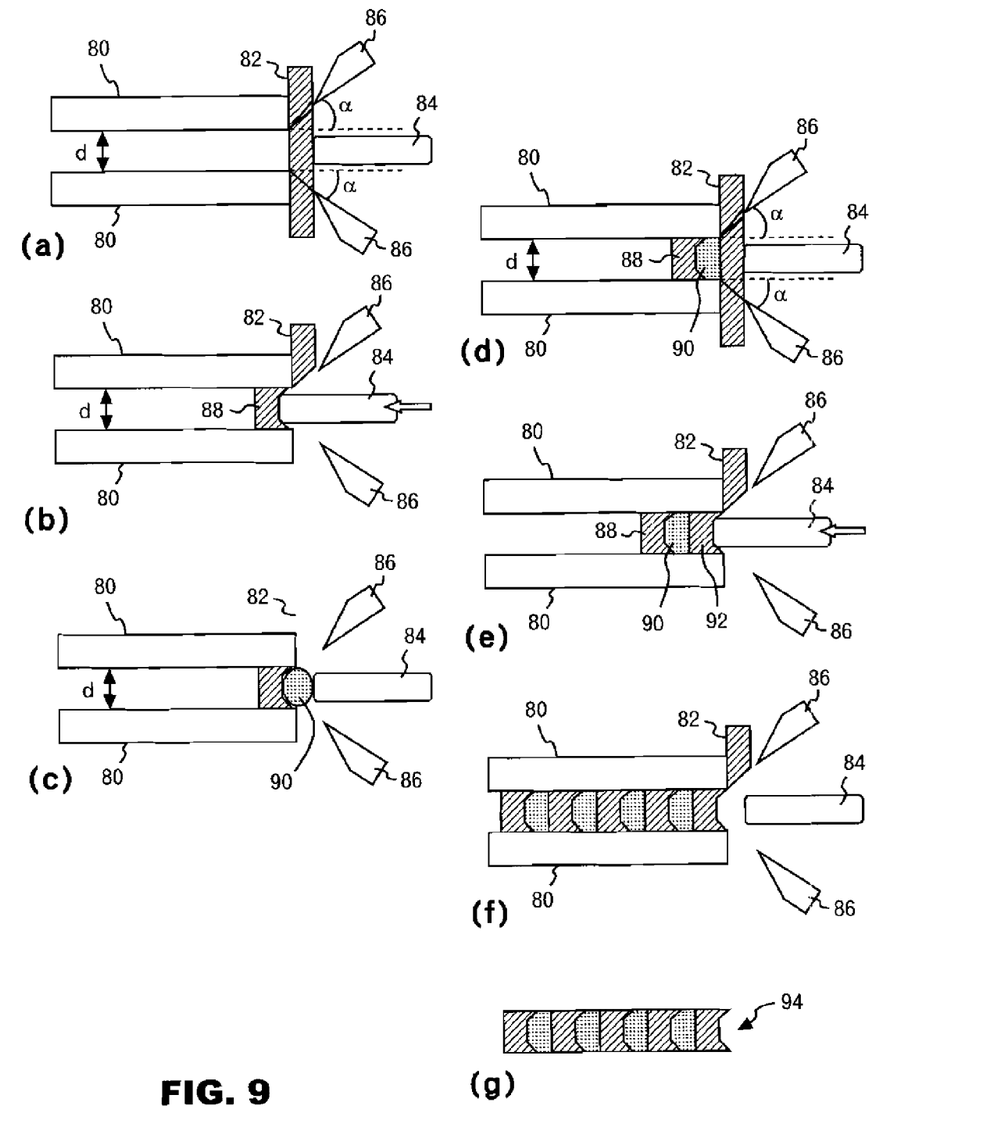
FIG. 9 is a view illustrating one Example of the manufacturing method of the present invention.

Another manufacturing method will be described by referring to FIGS. 9 and 10. In FIG. 9(a), a mold having two boards 80 distant from each other by the height (thickness) d of a sheet is prepared. A PSG sheet 82 is joined to one end surface of the boards 80. At this point, the sheet 82 is pressed and fixed to the boards 80 by use of a stick 84. The PGS sheet 82 is cut by use of two blades 86. The direction of the cutting is a direction tilted by an angle a with respect to a direction vertical to the surface of the sheet 82 (FIG. 9(a)). The cut sheet (block) 88 is pushed into the mold (between the two boards) by using the stick 84. Due to the force applied during the pushing, the ends of the sheet block 88 bend along the surfaces of the boards 80 (FIG. 9(b)). Next, an uncured elastic material 90 is inserted (FIG. 9(c)). Again, as in (a), the PGS sheet 82 is joined to the one end surface of the boards 80. The PGS sheet 82 is cut by use of the two blades 86 (FIG. 9(d)). A cut sheet (block) 92 is pushed into the mold (between the two boards) by using the stick 84 (FIG. 9(d)). By repeating the steps (a) to (e), a structure is obtained in which a predetermined number of PGS sheet blocks and elastic layers are stacked alternately (FIG. 9(f)). Lastly, the structure obtained in the step (f) is heated in an oven. The elastic material is cured, and then a sheet 94 of the present invention is obtained (FIG. 9(g)).

Figure 10:
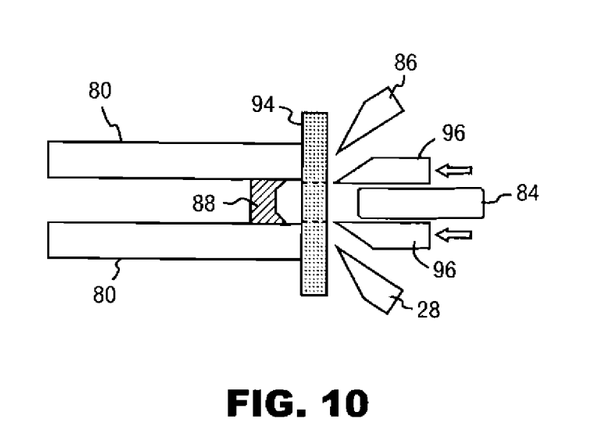
FIG. 10 is a view illustrating one Example of the manufacturing method of the present invention.

Refer to FIG. 10. In order to more accurately control the width of the elastic material 90 in FIG. 9, a sheet-like elastic material 94 which has been cured in advance is pressed and fixed to the boards 80. By using blades 96, the elastic sheet 94 is cut in a direction vertical to the surface thereof. The cut elastic sheet (block) is pushed into the mold (between the two boards) by using the stick 84. Thereafter, a liquid elastic material maybe injected in order to fill a space. All of these steps maybe performed under reduced pressure in order to prevent air from coming in and creating bubbles and the like.

The sheet 5 of the present invention manufactured by adopting any one of the above-described manufacturing methods is joined on the upper and lower surfaces to a surface of a heating body and a surface of a radiating body. As a result, for example, a thermal conduction module illustrated in FIG. 1 can be manufactured. Note that, in the joining, fluorine oil having high affinity (thermal binding property) to graphite may be applied to the contact surfaces in order to further reduce contact thermal resistance.

Example

Figure 11:
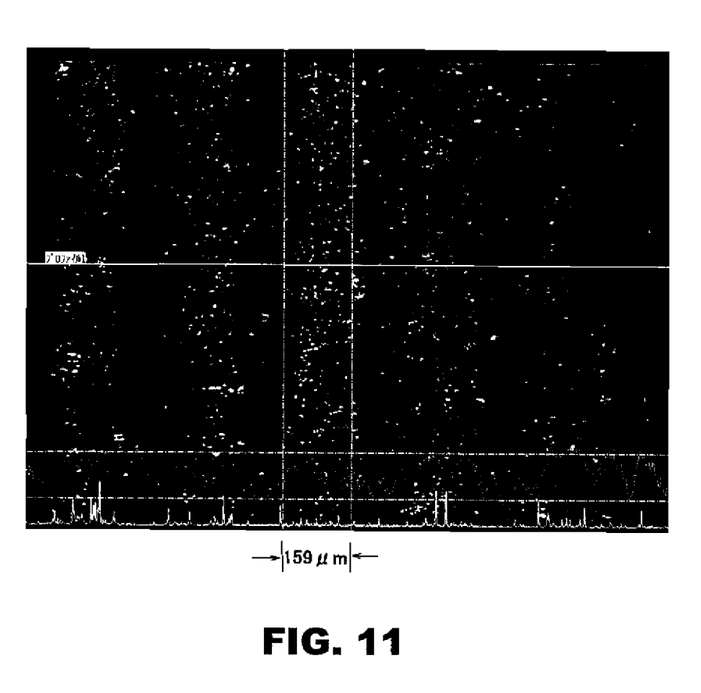
FIG. 11 is a view illustrating a surface (end surface) of a sheet (Example) manufactured by the method of the present invention.
Figure 12:
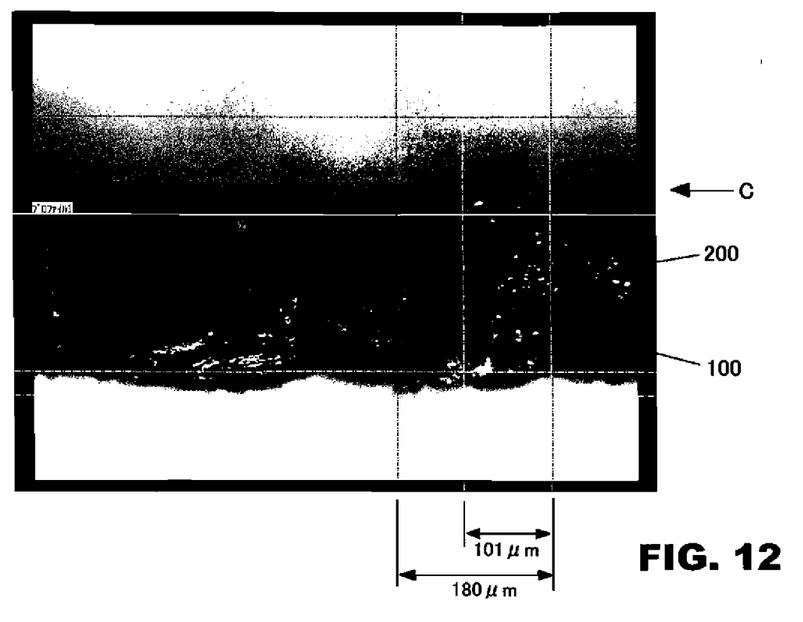
FIG. 12 is a view illustrating a cut surface of the sheet of FIG. 11.
Figure 13:
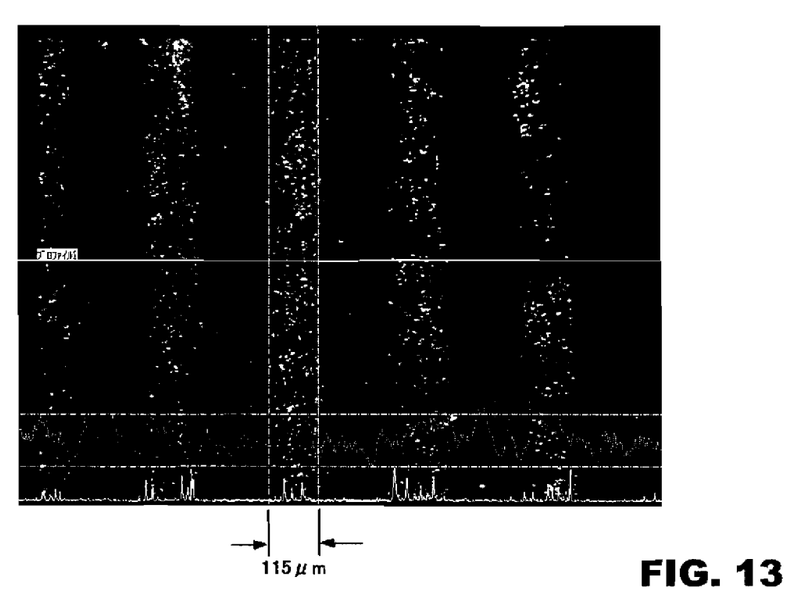
FIG. 13 is a view illustrating a surface (end surface) of a sheet of Comparative Example of the present invention.

FIG. 11 shows a microscope photograph of a surface (end surface) of a sheet (Example) manufactured by the method of the present invention. A "PGS" graphite sheet (product number: EYGS091310, thickness: 0.1 mm) made by Matsushita was used. The thickness of silicone elastomer after curing was 0.1 mm. The width of the individual PGS sheets (graphite layers) on the surface (end surface) was in a range from 0.16 to 0.17 mm. The graphite layers were each widened by approximately 60 to 70 μm compared to the original width. FIG. 12 is a microscope photograph of a cut surface of the same sample. A graphite layer 100 bends on a surface C so as to form a "U-letter" shape covering the surface of an elastomer 200. The width of the graphite layer 100 on the surface C is approximately 0.18 mm, indicating that the width was widened by approximately 80 μm compared to the original width. As Comparative Example, a stacking structure (sheet) having a flat end surface (cut surface) was prepared using the same PGS sheet. FIG. 13 is a microscope photograph of the surface of the sheet. In this case, the graphite layer had a width of 100 μm which was approximately equal to the original width.

Figure 14:
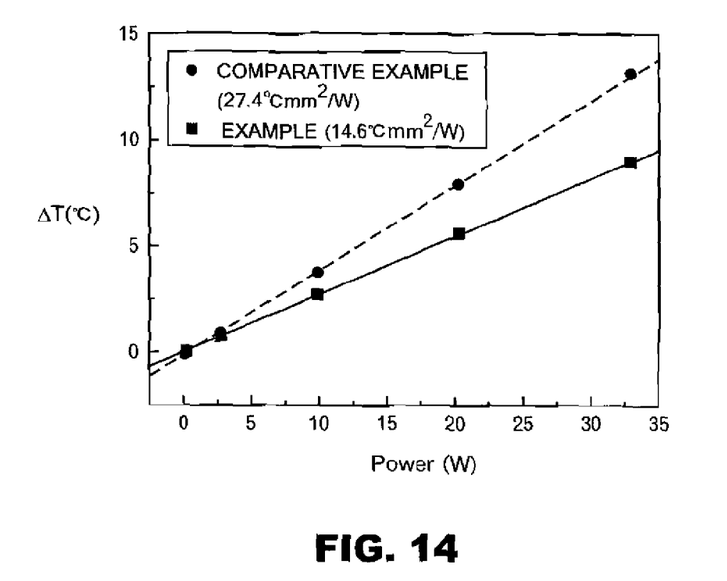
FIG. 14 is a view illustrating changes in temperature difference between both surfaces of sheets with respect to thermal inflow rate q.
Figure 15:
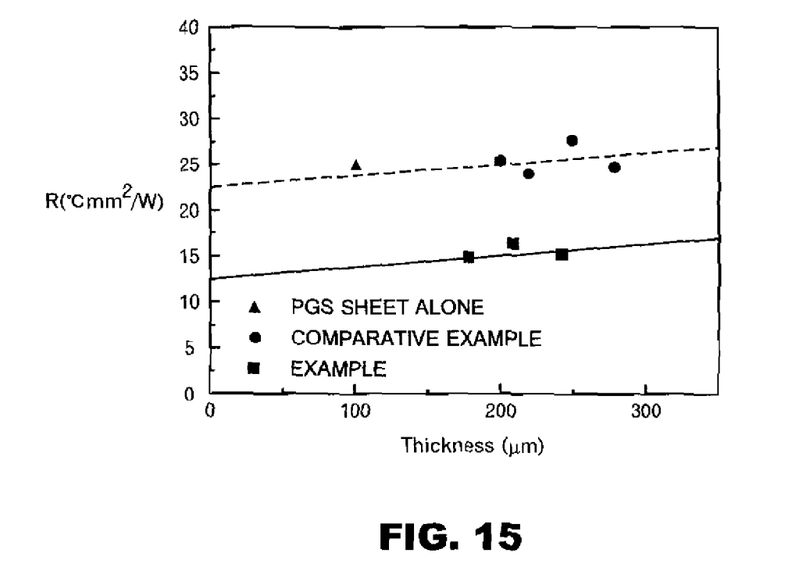
FIG. 15 is a view illustrating the relationship between the thickness and contact thermal resistance.

FIG. 14 is a graph showing changes in temperature difference between the both surfaces of the respective sheets of Example and Comparative Example with respect to heat inflow rate (q). The horizontal axis is heater power (W) corresponding to heat inflow rate (q). The vertical axis is a temperature difference (° C.) on both surfaces of the sheets. Thermal resistance values were calculated based on the slopes of the respective graph curves. The thermal resistance value of Example was 14.6° C.mm$^2$/W, while the thermal resistance value of Comparative Examples was 27.4° C.mm$^2$/W. The thermal resistance of Example of the present invention was approximately half (53%) of that of Comparative Example. FIG. 15 is a graph showing the relationship between the thickness (μm) and the contact thermal resistance (° C.mm$^2$/W) for Example and Comparative Example. For reference, the contact thermal resistance value of a PGS sheet (100 μm) alone is also shown in FIG. 15. Example of the present invention has a contact thermal resistance value smaller than that of Comparative Example and of a PGS sheet alone by approximately 10° C.mm$^2$/W (45%).

A sheet of the present invention has a wide range of applicability. For example, a sheet of the present invention can be applied not only to small electronic parts, such as a microprocessor, but also a large-sized electronic product, such as a plasma television. In the case where the scale of the length in a horizontal direction is several dozen mm, such as in a processor, the thickness of graphite layers (sheet) in a range from several dozen μm to 100 μm should be appropriate. Meanwhile, in the case where the scale of the length in a horizontal direction is several dozen centimeters, such as in a plasma television, the thickness in an approximate range from several mm to 10 mm should be appropriate.

The present invention has been described by taking FIGS. 1 to 15 as examples. However, the present invention is not limited to these examples. It is obvious to those skilled in the art that any modifications are possible within a range that does not depart from the gist of the present invention.

DESCRIPTION OF REFERENCE NUMERALS 1 heating body
3 heating body
5 sheet
7 radiating body
50, 66 graphite layer
52, 68 elastic layer
60 template (mold)
62 weight
64 block
70 sub-block (sheet)
72 sheet after etching
80 two sheets of boards
82 PGS sheet
84 stick
86 two blades
99 sheet block
90 uncured elastic material
92 cut sheet (block)
94 sheet

The invention claimed is:

1. A thermal conduction module, comprising: a heating body having an outer surface disposed in a first orientation; a radiating body having an outer surface disposed in the first orientation; and a sheet arranged between the outer surface of the heating body and the outer surface of the radiating body, wherein the sheet having a plurality of graphite layers and a plurality of elastic layers arranged alternately, wherein the graphite layers and elastic layers are oriented in a second orientation perpendicular to the first orientation and each graphite layer comprises first and second ends in the first orientation and a central layer portion in the second orientation and wherein individual layers of graphene within the central layer portion of the graphite layer are oriented in the second orientation, each of the ends of each graphite layer extending beyond one of a top and a bottom end of an adjacent elastic layer and being disposed in the first orientation so as to cover at least a part of a top or a bottom end of an adjacent elastic layer, and wherein one end surface of the graphite layer in the first orientation is in contact with the outer surface of the radiating body and another end surface in the first orientation is in contact with the outer surface of the heating body, wherein spaces occur between at least one of the outer surface of the heating body and the sheet and the outer surface of the radiating body and the sheet and further comprising a filling material in at least one of spaces between the outer surface of the heating body and the sheet, and between the outer surface of the radiating body and the sheet.

2. The thermal conduction module according to claim 1, wherein the filling material is made of one material selected from the group consisting of a silicone oil, a liquid metal, and a radiating grease.

3. The thermal conduction module according to claim 1, wherein each of the ends of the graphite layer in the first orientation covers ends of two neighboring elastic layers.

4. The thermal conduction module according to claim 1, wherein the elastic layer comprises a resin material having adhesiveness to the graphite layer.

5. The thermal conduction module according to claim 1, wherein
the heating body includes an IC chip, and
the radiating body includes a heat sink.

6. A thermal interface sheet for placement arranged between an outer surface of a heating body, and an outer surface of a radiating body, each outer surface being oriented in a first orientation, the sheet comprising: a plurality of graphite layers each having first and second ends and a central portion; and a plurality of elastic layers arranged alternately between graphite layers, wherein the elastic layers and the central portions of the graphite layers are oriented in a second orientation perpendicular to the first orientation and each graphite layer comprises first and second ends in the first orientation and a central layer portion in the second orientation and wherein individual layers of graphene within the central layer portion of the graphite layer are oriented in the second orientation, and wherein each of the ends of each graphite layer extends beyond one of a top and a bottom end of the an adjacent elastic layer and is disposed in the first orientation so as to cover at least a part of a top or a bottom end of an adjacent elastic layer, wherein spaces occur between at least one of the outer surface of the heating body and the sheet and the outer surface of the radiating body and the sheet and further comprising a filling material in at least one of spaces between the outer surface of the heating body and the sheet, and between the outer surface of the radiating body and the sheet.

7. The thermal interface sheet according to claim 6, wherein each of the ends of the graphite layer in the first orientation covers ends of two neighboring elastic layers.

8. The thermal interface sheet according to claim 6, wherein the elastic layer is made of a resin material having adhesiveness to the graphite layer.

* * * * *